(12) United States Patent
Fery et al.

(10) Patent No.: US 7,986,093 B2
(45) Date of Patent: Jul. 26, 2011

(54) ORGANIC ELECTROLUMINESCENT DIODE AND DIODE PANEL WITH ANTI-REFLECTIVE COATING CONDUCIVE TO THE EMISSION OF LIGHT

(75) Inventors: Christophe Fery, Niedereschach (DE); Gunther Haas, Saint-Egreve (FR)

(73) Assignee: Thomson Licensing, Boulogne-Billancourt (FR)

( * ) Notice: Subject to any disclaimer, the term of this patent is extended or adjusted under 35 U.S.C. 154(b) by 650 days.

(21) Appl. No.: 11/791,602

(22) PCT Filed: Dec. 5, 2005

(86) PCT No.: PCT/EP2005/056465
§ 371 (c)(1),
(2), (4) Date: Jun. 10, 2008

(87) PCT Pub. No.: WO2006/061363
PCT Pub. Date: Jun. 15, 2006

(65) Prior Publication Data
US 2008/0303416 A1 Dec. 11, 2008

(30) Foreign Application Priority Data
Dec. 7, 2004 (FR) ......................... 0452891

(51) Int. Cl.
*H01J 1/62* (2006.01)
(52) U.S. Cl. .................. 313/505; 313/509; 313/506
(58) Field of Classification Search ............... 313/505, 313/509, 506
See application file for complete search history.

(56) References Cited

U.S. PATENT DOCUMENTS

| | | | | |
|---|---|---|---|---|
| 6,670,772 B1* | 12/2003 | Arnold et al. | ............. | 315/169.3 |
| 7,332,859 B2* | 2/2008 | Hasegawa et al. | ............ | 313/504 |
| 2003/0173891 A1 | 9/2003 | Chiba et al. | | |
| 2004/0012328 A1* | 1/2004 | Arnold et al. | ................ | 313/504 |
| 2004/0178722 A1 | 9/2004 | Cok et al. | | |
| 2005/0174046 A1* | 8/2005 | Hasegawa et al. | ............ | 313/504 |
| 2005/0225232 A1* | 10/2005 | Boroson et al. | ............... | 313/504 |
| 2006/0017374 A1* | 1/2006 | Hasegawa et al. | ............ | 313/503 |

FOREIGN PATENT DOCUMENTS

| | | |
|---|---|---|
| EP | 1154676 | 11/2001 |
| JP | 2001-338770 | 12/2001 |
| JP | 2003-303685 | 10/2003 |
| WO | WO 2004/044998 | 5/2004 |

OTHER PUBLICATIONS

Chih-Jen Yang et al: "High-contrast top-emitting OLEDs for OLED displays", Lasers and Electro-Optics Society, 2004, Leos 2004, The 17th Annual Meeting of the IEEE Rio Grande, Puerto Rico, Nov. 8-9, 2004, vol. 1, Nov. 8, 2004, pp. 186-187.
Patent Abstracts of Japan, vol. 2003, No. 12, Dec. 5, 2003 & JP 2003-303685.
Patent Abstracts of Japan, vol. 2002, No. 4, Aug. 4, 2002 & JP 2001-338770.
Search Report Dated Mar. 30, 2006.

* cited by examiner

*Primary Examiner* — Peter Macchiarolo
(74) *Attorney, Agent, or Firm* — Robert D. Shedd; Jeffrey M. Navon

(57) ABSTRACT

The diode comprises an organic electroluminescent layer interposed between a lower electrode and a partially transparent and semireflective upper electrode, which itself comprises a transparent conducting sublayer and a current-distributing metal sublayer, for example an opaque grid. A dielectric antireflection layer is deposited on the grid to improve the emission contrast in ambient light, which grid, according to an advantageous embodiment, is designed to optimize the semireflective properties of the upper electrode, thereby improving, by an optical cavity effect, extraction of the emitted light.

12 Claims, 4 Drawing Sheets

ORGANIC ELECTROLUMINESCENT DIODE AND DIODE PANEL WITH ANTI-REFLECTIVE COATING CONDUCIVE TO THE EMISSION OF LIGHT

REFERENCE TO RELATED APPLICATIONS

This application claims the benefit, under 35 U.S.C. 365 of International Application PCT/EP2005/056465, filed Dec. 5, 2005, which was published in accordance with PCT Article 21(2) on Jun. 15, 2006 in French and which claims the benefit of French Patent application No. 0452891, filed Dec. 7, 2004.

BACKGROUND

Field of the Invention

The invention relates light-emitting diodes (LEDs), and more particularly, it relates to organic light emitting diodes (OLED) and to arrays of these diodes, especially those that form illumination or image display panels.

SUMMARY

According to an embodiment, an organic light-emitting diode capable of emitting light includes:
- a substrate; —an organic electroluminescent layer interposed between a lower electrode and a partially transparent upper electrode comprising a transparent conducting sublayer, which is continuous and of uniform thickness, and an opaque current-distributing metal sublayer that has windows for passage of the light emitted by the electroluminescent layer; and
- a transparent dielectric antireflection layer in contact, via its external face, with a medium, generally air, and, in contact via its internal face, with the transparent conducting sublayer and the opaque metal sublayer.

This referred to as a "top-emitting" diode (i.e. one that emits on the opposite side from the substrate). Such diodes may have a conventional structure, in which case the upper electrode is a cathode, or reverse structure, in which case the upper electrode is an anode.

According to one embodiment, the upper electrode of this diode is at least a bilayer having a transparent conducting main sublayer and an opaque current-distributing sublayer. The transparent conducting later ensures uniform distribution of the electrical charges into the electroluminescent layer so as to create a uniform electric field in the thickness of this layer. The opaque current-distributing sublayer is, for example a metal grid that essentially serves to increase the conductivity of the upper electrode and between the bars of which the light emitted in the electroluminescent layer can pass.

Reflection of the ambient light of the opaque current-distributing sublayer, for example on the bars of the abovementioned grid, greatly degrade the emission contrast of the diode in ambient light. By applying an antireflection layer of uniform thickness, that is to say as a "complete layer", over the entire active surface of the diode, it is possible to solve this problem. However, this antireflection layer risks degrading the overall transparency of the upper electrode and consequently the luminous efficiency of the diode.

One object of the invention is to provide an optimum compromise between the antireflection function of such a layer in the opaque zones of the upper electrode and the overall optical properties of the upper electrode. This is to guarantee the best performance in terms of extracting the light emitted by the diode through this electrode.

In accordance with this implementation of the invention, an organic light-emitting diode capable of emitting light includes a substrate; an organic electroluminescent layer capable of emitting light, interposed between a lower electrode and a partially transparent upper electrode, which are designed to pass a current through the organic electroluminescent layer and thus cause, within this layer, the emission of light. The upper electrode includes at least one transparent conducting sublayer of approximately uniform thickness and a metal sublayer for distributing the current. The current is distributed in opaque zones between which there are gaps in this sublayer that form windows for passage of the light emitted by the electroluminescent layer. A transparent dielectric antireflection layer of approximately uniform thickness is in contact, via its external face, with a medium, generally air, and, in contact via its internal face, with the transparent conducting sublayer and the opaque metal sublayer. The material and the thickness of the dielectric antireflection layer are chosen with the material of the current-distributing metal sublayer so that the reflectance of the opaque zones, measured at normal incidence at a wavelength $\lambda_{amb}$ close to 550 nm, is less than 0.1.

The lower electrode itself is therefore interposed between the substrate and the electroluminescent layer.

Preferably, the diode also includes a reflective lower layer designed to reflect the emitted light, which layer is interposed between the substrate and the organic electroluminescent layer or is integrated into the substrate.

As a result of this reflective lower layer, extraction of the light emitted by the diode and the luminous efficiency of the diode are substantially improved.

Preferably, this reflective lower layer is formed by or is an integral part of the lower electrode, and is therefore generally metallic and opaque.

According to other possible embodiments:
- this reflective lower layer is interposed between the substrate and the lower electrode, which is therefore transparent or semitransparent;
- this reflective lower layer is interposed between the lower electrode and the organic electroluminescent layer;
- this reflective lower layer is an integral part of the substrate. In this case of a substrate formed by an active matrix, the reflective lower layer may be formed by one of the layers of the active matrix.

This reflective lower layer may be made of a dielectric and have a multilayer structure (Bragg reflector).

The current-distributing metal sublayer preferably takes the form of a grid, the bars of which have a thickness large enough to substantially improve the current distribution while leaving, between these bars, windows wide enough for passage of the light emitted by the electroluminescent layer. The light emitted by the electroluminescent layer in the direction of the opaque zones, especially the bars, of the current-distributing metal sublayer is in general reflected off these opaque zones inside the diode. The upper electrode is therefore partially transparent, in particular because of the opaque zones of the current-distributing metal sublayer.

The current-distributing metal sublayer is deposited directly on a transparent conducting sublayer, among the one or plurality of transparent or semitransparent conducting sublayers. The transparent conducting sublayer on which the current-distributing sublayer is deposited directly is generally based on a semiconducting oxide such as ITO (Indium Tin Oxide). A metal such as silver may also be used for this transparent conducting sublayer, in which case its thickness is very small so as to be transparent, or at least semitransparent, in nature. It is also possible to use two transparent conducting sublayers, one deposited on the other, namely a silver-based sublayer and then an ITO-based sublayer. The at least one transparent or semitransparent conducting sublayer covers the entire active area of the diode and normally does not have holes. Its thickness is generally constant over the entire active area of the diode.

The light emitted by the electroluminescent layer passes through the upper electrode via the windows or holes made between the opaque zones of the current-distributing metal sublayer. The surface conductivity of this metal sublayer is, at the places of these opaque zones, such as for example at the places of the bars of the aforementioned grid, preferably at least 10 times greater than that of at least one subjacent transparent conducting sublayer so as to ensure that the current flowing in the upper electrode is effectively distributed.

The transparent dielectric antireflection layer is deposited directly on an aforementioned current-distributing metal sublayer. It is therefore in contact, via its internal face, on the one hand, with the current-distributing metal sublayer at the places of the opaque zones and, on the other hand, with this transparent conducting sublayer through the windows in the distributing sublayer. According to the invention, owing to the coating of the opaque zones with this antireflection layer, the reflectance of ambient light at the places of these opaque zones is less than 0.1. More precisely, this reflectance is measured at normal incidence at a wavelength $\lambda_{amb}$ close to 550 nm. The wavelength $\lambda_{amb}$ corresponds to the approximate wavelength of the maximum emittance in ambient light, taking into account the spectral sensitivity of the human eye.

According to the invention, the transparent dielectric layer therefore provides, as first function, an optimum antireflection effect for ambient light with respect to the reflective surface of the opaque current-distributing conducting sublayer. The emission contrast of the diode in ambient light is therefore improved.

Preferably, if $n_1$ is the optical index of said medium at the wavelength $\lambda_{amb}$, the material of index $n_2(\lambda_{amb})$ measured at the wavelength $\lambda_{amb}$, and the thickness $d_2$ of said dielectric antireflection layer are chosen with the material of index $ñ_3$ of said current-distributing metal sublayer, which is measured at the same wavelength $\lambda_{amb}$ and is defined by its argument $n_3$ and its phase $\Phi$ in such a way that $ñ_3 = n_3 e^{i\Phi}$, so as to approximately satisfy the equation:

$$n_2(\lambda_{amb}) = \frac{\sqrt{-(n_1\cos(\phi) - n_3 + n_3\sin^2(\phi))n_3n_1(n_1\sin^2(\phi) + n_3\cos(\phi) - n_1)}}{-(n_1\sin^2(\phi) + n_3\cos(\phi) - n_1)}$$

Thanks to the choice of materials, especially of the antireflection layer and the current-distributing layer, a low or very low reflectivity of the ambient light on the opaque zones of the upper electrode is then obtained, thereby appreciably improving the emission contrast of the diode in ambient light.

Furthermore, and to supplement the antireflection function, preferably the material of index $n_2(\lambda_{amb})$ measured at a wavelength $\lambda_{amb}$ close to 550 nm, and the thickness $d_2$ of said dielectric antireflection layer are chosen so as to approximately satisfy the equation:

$$d_2 = \frac{\lambda_{amb}}{4n_2(\lambda_{amb})}\left(p - \frac{\phi_{2-3}}{\pi}\right)$$

where p is any even integer and where $\Phi_{2-3}$ is the phase shift of a light ray of wavelength $\lambda_{amb}$ after reflection at the interface between the dielectric antireflection layer and the current-distributing metal sublayer.

The equation giving the value of $d_2$ expresses here the destructive interference of the ambient light within the dielectric antireflection layer.

Thanks to this thickness of the antireflection layer, a low or very low reflectivity of the ambient light on the upper electrode is then obtained, thereby further improving the emission contrast of the diode in ambient light.

Preferably, the material of said dielectric antireflection layer and the material of said current-distributing metal sublayer are, respectively:
- either silicon nitride and tantalum;
- or titanium oxide and a metal from among nickel, chromium, titanium and vanadium;
- or zinc selenide and a metal from among nickel, chromium, titanium and vanadium.

The dielectric antireflection layer and the at least one transparent conducting sublayer make up a semireflective upper layer designed to partially reflect said light emitted by the electroluminescent layer. The reflective lower layer and this semireflective upper layer made up in this way thus define an optical cavity. The material the thickness of said dielectric antireflection layer are chosen with the material and the thickness of the transparent conducting sublayer so that the semireflective upper layer partially reflects the emitted light.

Thus, the diode comprises a semireflective upper layer that is designed to partially reflect said emitted light and is at least partly integrated into the upper electrode. According to the invention, the transparent dielectric layer, which belongs to this semireflective upper layer, therefore provides, as second function, an optimization effect whereby it optimizes the semireflective character of this semireflective upper layer. The same transparent dielectric layer, of approximately uniform thickness, and therefore advantageously deposited without a mask, therefore serves both as antireflection layer and as layer improving the reflectivity of one of the walls of the optical cavity.

The upper electrode may also include a charge-injection sublayer interposed between the organic electroluminescent layer and the transparent conducting sublayer, which may also form part of the semireflective upper layer.

If the upper electrode is a cathode, a metal with a low work function, such as calcium, may be chosen for it; it is also possible to use a mixture of the LiF+Al type. If the upper electrode is an anode, a metal with a high work function, such as silver or gold, may be chosen for it.

The upper electrode may include a second semitransparent conducting sublayer, which may especially serve as a diffusion barrier when it is interposed between the organic electroluminescent layer and the other transparent conducting sublayer. This second semitransparent conducting sublayer is therefore also intended to prevent the diffusion of components of the upper electrode into the organic electroluminescent layer, so as to prevent it from degrading. Preferably, silver is used for this sublayer.

Since the reflective lower layer and the semireflective upper layer define an optical cavity for the light emitted by the organic electroluminescent layer, the distance $d_6$ between these layers defining this optical cavity is preferably adapted so as to obtain within this cavity, constructive interference of the light emitted. This constructive interference advantageously promotes extraction of the emitted light through the upper electrode, thereby improving the luminous efficiency of the diode.

Preferably, said distance $d_6$ then approximately satisfies the following equation:

$$d_6 = \frac{\lambda}{2n_6}\left(q - \frac{\phi_{tot}}{2\pi}\right)$$

where q is any integer;
where λ is a wavelength close to maximum emittance of the emitted light and $n_6$ is the average index of the organic electroluminescent layer at this wavelength λ; and
where $\Phi_{tot}$ is the total phase shift of a ray of emitted light, after reflection off the reflective lower layer and off the semireflective upper layer.

Preferably, as regards the semireflective upper layer, the index $n_2$ measured at the wavelength λ and the thickness $d_2$ of said dielectric antireflection layer, the index $n_4$ measured at the wavelength λ and the thickness $d_4$ of a transparent conducting first sublayer and, where appropriate, the index $n_5$ measured at the wavelength λ and the thickness $d_5$ of a transparent conducting second sublayer are chosen in combination so that the reflectance of the stack of said layers and sublayer, measured at this wavelength λ at normal incidence, is maximum. This advantageously results in the best compromise between transparency and reflectivity of this stack, these two factors contributing to the best luminous efficiency of the diode.

According to another embodiment relating to the semireflective upper layer, this layer may have a multilayer dielectric structure (Bragg reflector) as described in document US 2003/184982, which is deposited on the upper electrode. This multilayer structure may serve to encapsulate the diode, as illustrated in document WO 03/052842.

Thus, by increasing the optical cavity effect, the constructive interference in this cavity is further increased, thereby improving extraction of the emitted light and the luminous efficiency of the diode.

In practice, having chosen the material of the transparent conducting sublayer according to conductivity and transparency criteria and chosen the material and thickness of the semireflective upper layer according to performance criteria governing charge injection and barrier to diffusion into the organic electroluminescent layer, the thickness of the transparent conducting sublayer is determined so as to obtain the maximum reflectivity at normal incidence of the light emitted in the electroluminescent organic layer off the interface with the semireflective upper layer.

Preferably, said reflective lower layer is at the interface between said lower electrode and said organic electroluminescent layer, and said semireflective upper layer is at the interface between said upper electrode and said organic electroluminescent layer.

In this case, each electrode has a reflecting function.

The distance $d_6$ then corresponds to the thickness of the organic electroluminescent layer between the electrodes and the above equation giving the approximate value of $d_6$ expresses constructive interference of the light emitted in the optical cavity bounded here by the lower electrode and the upper electrode.

Preferably, the distance separating the organic electroluminescent layer from the reflective lower layer is adapted so as to obtain constructive interference between said emitted light and the light reflected off this reflective lower layer.

Preferably, said organic electroluminescent layer then comprises an emissive organic sublayer and at least one nonemissive lower organic sublayer that is interposed between said reflective lower layer and said emissive sublayer, and the thickness of the nonemissive lower organic sublayer(s) is (are) adapted so that the distance z separating the center of said emissive organic sublayer of said reflective lower layer approximately satisfies the equation:

$$z = \frac{\lambda}{2n_6}\left(r - \frac{\phi_{inf}}{2\pi}\right)$$

where r is any integer;
where λ is said wavelength close to the maximum of emittance for the emitted light and $n_6$ is the average index of the organic electroluminescent layer at this wavelength;
and
where $\Phi_{inf}$ is the phase shift of a ray of emitted light after reflection off the reflective lower layer.

The center of the emissive organic sublayer corresponds to a level in this sublayer approximately equidistant from the lower face and the upper face of this sublayer.

In general, the nonemissive lower organic sublayer or sublayers are designed to inject and/or transport carriers of a first type. The electroluminescent organic layer then preferably also comprises at least one nonemissive upper organic sublayer that is interposed between the upper electrode and said emissive sublayer and is preferably designed to inject and/or transport carriers of a second type. The carrier types correspond to electrons and holes.

The subject of the invention is also an image display or illumination panel comprising a plurality of diodes according to the invention, characterized in that these diodes are supported by the same substrate.

Preferably, the upper electrode is then common to the plurality of these diodes. The transparent conducting sublayer of this electrode then extends over the entire active area of the panel.

Preferably, the opaque conducting sublayer of the common upper electrode forms a current-distributing grid on this electrode.

To summarize the above main features, the subject of the invention is an organic light-emitting diode and a panel comprising an array of these diodes. This diode comprises an organic electroluminescent layer interposed between a lower electrode and a partially transparent and semireflective upper electrode, which itself comprises a transparent conducting sublayer and a current-distributing metal sublayer, for example an opaque grid. A dielectric antireflection layer is deposited on the grid to improve the emission contrast in ambient light, which, according to an advantageous embodiment, is designed to optimize the semireflective properties of the upper electrode, thereby improving, by an optical cavity effect, the extraction of emitted light.

BRIEF DESCRIPTION OF THE DRAWINGS

The invention will be more clearly understood on reading the following description, given by way of nonlimiting example and with reference to the appended figures in which.

DETAILED DESCRIPTION

Figure 1:
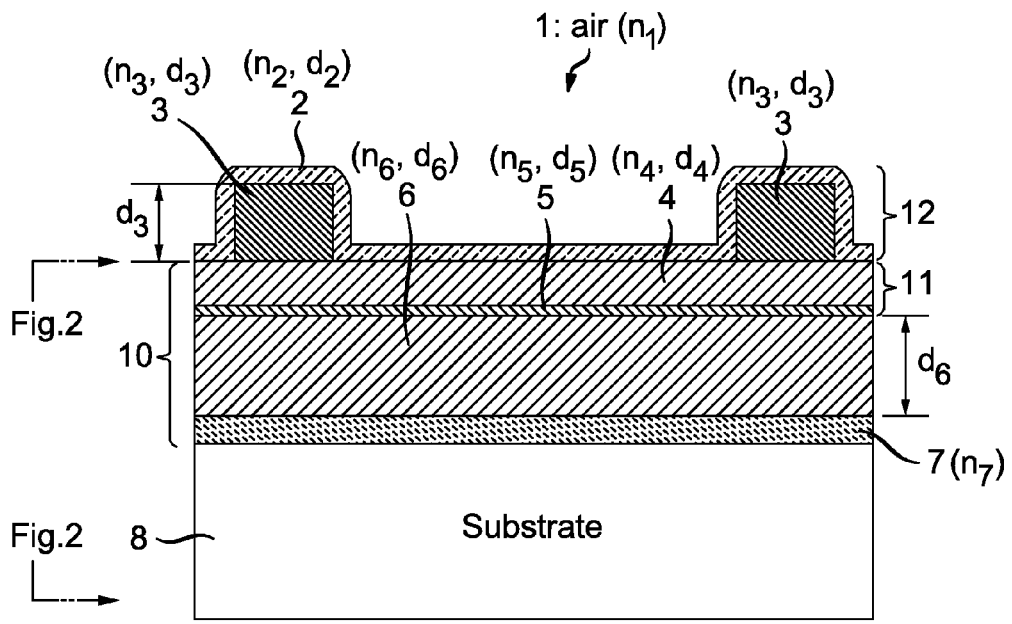
FIG. 1 is a schematic cross section of an entire diode according to a first embodiment of the invention.

A first embodiment of a diode or a diode array according to the invention will now be described with a few nonlimiting embodiments, together with a few steps in its fabrication, referring in particular to FIGS. 1 and 2.

Fabrication starts with a substrate 8, for example a glass plate or an active matrix that includes diode drivers. This substrate is provided with a reflective metal lower electrode 7 or an array of said electrodes, which are intended to act as cathodes. Each lower electrode being connected to an output of a driver on the substrate. The lower layer of one or more lower electrodes here is made of aluminum or chromium. Its thickness is about 0.1 µm.

Figure 2:
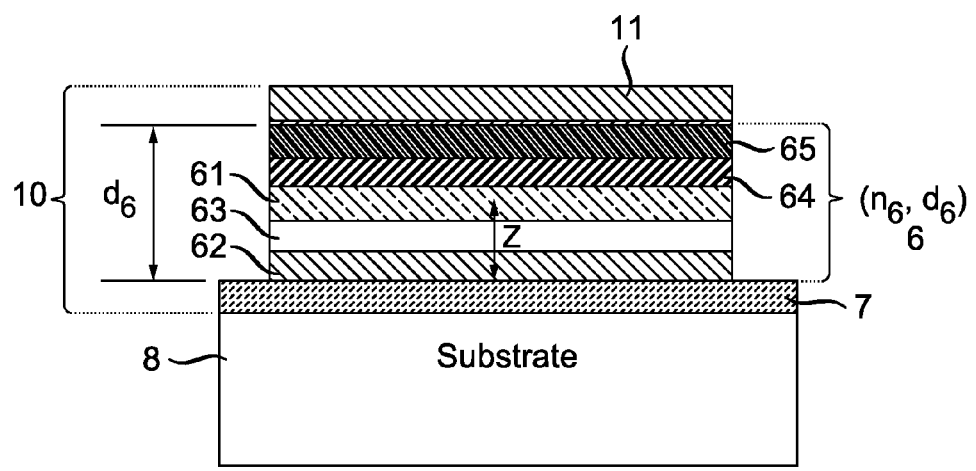
FIG. 2 is a detailed cross section of the stack of organic sublayers of the diode according to FIG. 1, between the lower electrode and the upper electrode.

Deposited on this lower layer of one or more reflective electrodes 7, in a manner known per se, is an organic electroluminescent layer 6 formed from the following stack, as shown in FIG. 2:

a sublayer 62 of cesium-doped 4,7-diphenyl-1,10-phenanthroline (BPhen) for injecting and transporting electrons, having a thickness $d_{62}$, that will be specified later;

a sublayer 63 of undoped 4,7-diphenyl-1,10-phenanthroline (BPhen) with a thickness $d_{63}$=10 nm, for blocking holes;

an emissive sublayer 61 of thickness $d_{61}$=20 nm, designed to emit light when a current passes through it, for example red, green, blue or white light, the emittance from this sublayer having a maximum for a wavelength λ;

a sublayer 64 of 2,2',7,7'-tetrakis(N,N-diphenylamino)-9,9'-spiro-bifluorene (Spiro-TAD) with a thickness $d_{64}$=10 nm, for blocking electrons; and a sublayer 65 of 2,2',7,7'-tetrakis-(N,N'-di-m-methylphenylamino)-9,9'-spirobifluorene (Spiro m-TTB) doped with a p-dopant, such as F4-TCNQ (tetrafluorotetracyanoquinodimethane) for injecting and transporting holes, with a thickness $d_{65}$ that will be specified later.

To form the upper electrode layer 11, which serves here as the anode, the following are deposited:

a second semitransparent conducting sublayer 5, made of silver, with a thickness $d_5$=15 nm approximately. This sublayer advantageously provides a barrier against the diffusion of atoms from the upper layers, which protects the organic electroluminescent layer 6 from a risk of degrading;

a first semitransparent conducting sublayer 4, which is a "complete" layer, that is to say without any holes intentionally made in it. This layer consists of a mixed indium tin oxide (ITO) with a thickness $d_4$ that will be specified later; and an opaque current-distributing metal sublayer 3 formed from an array of parallel metal bars leaving between them large apertures or windows for passage of the light emitted by the electroluminescent layer 6, each bar here having a thickness $d_3$ equal to or greater than 100 nm. The thickness $d_3$ is set, depending on the metal chosen, to obtain a surface conductivity at least 10 times higher than that of the ITO sublayer 4 so as to ensure that the current flowing in the electrode is effectively distributed. The metallic material of the bars has an index $\tilde{n}_3$ measured at the wavelength $\lambda_{amb}$ corresponding approximately to the maximum spectral sensitivity of the eye, i.e. about 550 nm.

Next, a transparent dielectric layer 2 of index $n_2$ ($\lambda_{amb}$) measured at the wavelength $\lambda_{amb}$ is deposited on the upper electrode layer 11. This layer is continuous, with a uniform thickness $d_2$, and contains no holes except, possibly, as a result of defects. This layer, designed to provide an antireflection function, is therefore in contact, via its internal face, with the opaque bars or zones of the current-distributing metal sublayer 3 and also with the transparent conducting sublayer 4 through the windows located between the bars of the metal sublayer 3.

The nature of the materials of the first transparent conducting sublayer 4 and the dielectric antireflection layer 2 are adapted so as to protect the subjacent organic layer 6 from the risk of degrading by oxygen and/or water vapor from the ambient air. This sublayer 4 and/or this layer 2 therefore also have the function of encapsulating the diode.

The transparent dielectric layer 2 is then in contact, via its external face, with a medium 1 of index $n_1$ measured at the wavelength $\lambda_{amb}$, this medium 1 being air. According to a first alternative embodiment (not described in detail), the diode is encapsulated in a sealed package filled with a gas or a fluid, which therefore defines the medium 1. According to a second nonlimiting alternative embodiment, an additional encapsulation layer is added on top of the transparent dielectric layer 2. The medium 1 then corresponds to the material of this encapsulation layer.

The stack, on the substrate 8, includes the at least one electrode of the lower layer 7, the organic electroluminescent layer 6, the upper electrode layer 11 and the antireflection layer 2, and therefore forms an organic light-emitting diode or array of diodes, according to one embodiment of the invention. Certain parameters of this embodiment will now be specified.

According to an embodiment of the invention, the material of index $n_2(\lambda_{amb})$ and the thickness $d_2$ of the dielectric layer 2 are chosen with the material of index $\tilde{n}_3$ of the opaque metal sublayer 3 so that the reflectance of the bars of the opaque metal sublayer 3, measured at $\lambda_{amb}$ (about 550 nm) at normal incidence, is less than 0.1. The dielectric layer 2 then has an antireflection function with respect to the bars that form here opaque zones in the transparent upper electrode. A substantial portion of the ambient light is no longer reflected off the opaque zones of the upper electrode of the diode, thereby significantly improving the emission contrast performance of the diode in ambient light.

A first non-limiting way of making this choice will now be described.

Figure 3:
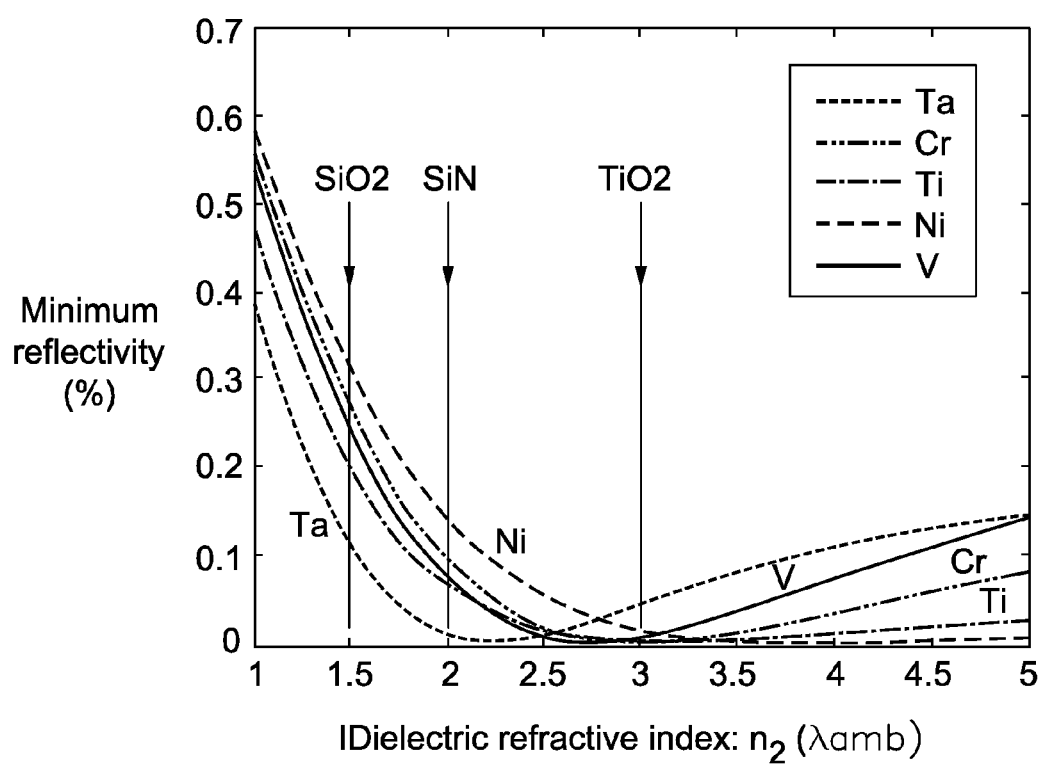
FIG. 3 illustrates the change in the minimum reflectivity of a metal as a function of the "theoretical" index of the material of a dielectric layer covering this metal in order to provide an antireflection function.

FIG. 3 illustrates, for a set of metals, capable of forming the grids of the current-distributing sublayer 3 (namely Ta, Cr, Ti, Ni and V), the variation in minimum reflectivity at $\lambda_{amb}$ of a metal as a function of the index $n_2$ ($\lambda_{amb}$) of the material of a dielectric layer covering this metal in order to provide an antireflection function. The index values $n_2(\lambda_{amb})$ of the dielectrics $SiO_2$, SiN and $TiO_2$ have been indicated.

The choice according to the invention consists in selecting a metal/dielectric pair for which the minimum reflectivity is obtained for a value $n_2^o$ close to the value $n_2$ of the index of one of the dielectrics. Thus, for example:
- with titanium oxide, chromium, titanium, nickel or vanadium being used, chromium will be preferred among these metals as it is widely used in microelectronics; and
- with silicon nitride, tantalum will be used.

According to this method, the use of silica for the dielectric antireflection layer is to be avoided, at least with the metals listed above.

A second non-limiting way of making this choice will now be described.

Among the general knowledge of a person skilled in the art is the fact that the index $n_2^o$ ($\lambda_{amb}$) that the dielectric of the antireflection layer must have satisfies the following equation:

$$n_2^o(\lambda_{amb}) = \frac{\sqrt{-(n_1\cos(\phi) - n_3 + n_3\sin^2(\phi))n_3 n_1(n_1\sin^2(\phi) + n_3\cos(\phi) - n_1)}}{-(n_1\sin^2(\phi) + n_3\cos(\phi) - n_1)}$$

Table 1 below gives the complex index $\tilde{n}_3$ at $\lambda_{amb}$ of various metals (namely Cr, Ta, Ti, Ni, V and Co), and the index $n_2^o$ at $\lambda_{amb}$ these being calculated according to this equation (with $n_1=1$). In the right-hand part of the table are the actual index values of certain dielectrics, namely $SiO_2$, SiN and $TiO_2$.

TABLE 1

| Metal | $\tilde{n}_3$ | $n_2^o$ | $d_2$ | Dielectric | $n_2$ |
|---|---|---|---|---|---|
| Cr | 2.8 + 3.3 i | 2.97 | 27 nm | $SiO_2$ | 1.5 |
| Ta | 2.74 + 1.97 i | 2.23 | 39 nm | SiN | 2.0 |
| Ti | 1.79 + 2.42 i | 3.03 | 20 nm | $TiO_2$ | 3.0 |
| Ni | 1.69 + 2.99 i | 3.83 | 15 nm | | |
| V | 3.59 + 3.21 i | 2.75 | 33 nm | | |
| Co | 2.02 + 3.72 i | 3.95 | 17 nm | | |

The choice according to the invention consists in selecting a metal/dielectric pair for which the corresponding values of $n_2^o$ and $n_2$ are also as close as possible to each other. Thus, for example:
- with titanium oxide, chromium, titanium, cobalt and vanadium being used, chromium will be preferred among these metals as it is widely used in microelectronics;
- with silicon nitride, tantalum will be used.

According to this method, the use of silica for the dielectric antireflection layer is to be avoided, at least with the metals listed above.

For the remaining portion of the description, the Cr—$TiO_2$ pair will be used.

Having chosen both the material (chromium) for the grid forming the opaque conducting sublayer 3 penetrated by windows, and the material (titanium oxide) for the dielectric antireflection layer 2, it remains in particular to determine the ideal thickness $d_2$ of this dielectric layer.

Preferably, if $\phi_{2-3}$ is the phase shift of a light ray of wavelength $\lambda_{amb}$ after reflection at the interface between the dielectric layer 2 and the bars of the metal sublayer 3, the thickness $d_2$ is chosen so as to approximately satisfy the equation:

$$d_2 = \frac{\lambda_{amb}}{4n_2(\lambda_{amb})}\left(p - \frac{\phi_{2-3}}{\pi}\right)$$

where p is any even integer and where $\lambda_{amb}$ is a wavelength close to the maximum emittance of the ambient light, generally around 550 nm. The equation thus giving the value $d_2$ expresses destructive interference of the ambient light within the dielectric antireflection layer above the opaque zones of the current-distributing metal layer 3.

As indicated in Table 1, a result is therefore $d_2=27$ nm (for p=0). The table also indicates the values $d_2$ (always for p=0) that would be obtained using titanium oxide on other metals. The variations in $d_2$ reflect the $\phi_{2-3}$ values specific to each metal.

In the diode according to the invention, between the opaque zones of the upper electrode (that is to say between the bars of the grid), the organic layer 6 is coated with a stack consisting of three sublayers which form a semireflective upper layer. These three sublayers are, for example, the second semitransparent conducting sublayer 5 of thickness $d_5=15$ nm made of silver, the first semitransparent conducting sublayer 4 of thickness $d_4$ made of ITO and, between the bars, of thickness $d_3>100$ nm of the current-distributing metal layer 3, the dielectric layer 2 of thickness $d_2=27$ nm made of titanium oxide.

According to an advantageous variant of the invention, the thickness $d_4$ of the transparent conducting sublayer 4 of the upper electrode is chosen so as to obtain approximately the maximum of reflectance of this stack of the three sublayers for the light emitted by the electroluminescent layer. This reflectance is measured here at the predefined wavelength $\lambda$ for which the emittance of the emissive sublayer 61 has a maximum. The dielectric layer 2 therefore provides two functions, namely the ambient light antireflection function described above, and the function of improving the reflection properties of the semireflective upper layer for the light emitted by the electroluminescent layer.

Moreover, at the location of the bars of the current-distributing metal layer 3, that is to say the lower surface of the bar that advantageously provides the function of reflecting the light emitted by the electroluminescent layer, it may be seen that the current-distributing metal layer 3 also provides two functions, namely the function of distributing the current and the function of reflecting the light emitted by the electroluminescent layer.

The upper electrode therefore forms, in combination with the dielectric layer 2, a semireflective surface, which reflects the emitted light back towards the interior of the diode. What is therefore obtained between the two electrodes (i.e., reflective lower and semireflective upper) is an optical cavity for the light emitted at the wavelength $\lambda$ in the electroluminescent layer.

Thanks to the maximum reflectance of the upper electrode with the dielectric layer 2 obtained as described above, this optical cavity effect is enhanced, thereby improving the extraction of the light emitted and the luminous efficiency of the diode.

Figure 4:
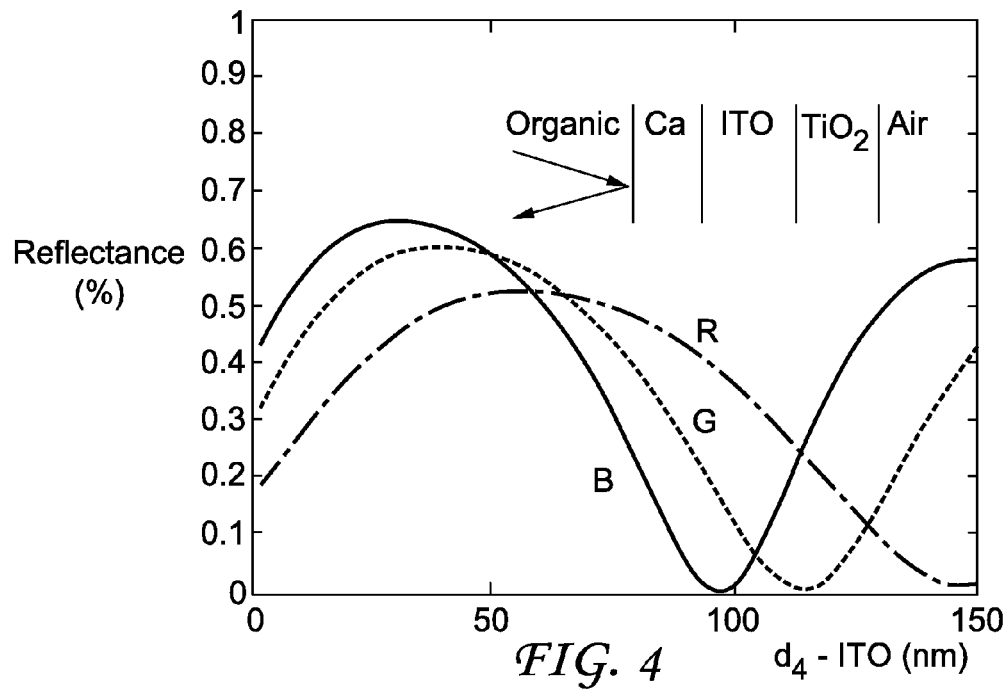
FIG. 4 shows the variation of the reflectance of a stack consisting of a 15 nm calcium sublayer, an ITO sublayer of thickness $d_4$ and a 27 nm titanium oxide dielectric layer as a function of the thickness $d_4$ (in nm) of the ITO layer that are used as upper layers or sublayers in the diode according to the first embodiment.

A method of choosing the thickness $d_4$ of the ITO conducting first sublayer 4 will now be described in a non-limiting manner. FIG. 4 shows the variation of the reflectance of the stack described above as a function of this thickness $d_4$. This figure shows three curves, a first curve R for a wavelength in the red, which can be used for diodes emitting in the red, a second curve G for a wavelength in the green, which can be used for diodes emitting in the green, and the last curve B for a wavelength in the blue, which can be used for diodes emitting in the blue. A $d_4$ value corresponding to the maximum of reflectance is chosen from this figure. Table 2 below indicates the $d_4$ values thus chosen: 60 nm for red, 40 nm for green and 30 nm for blue.

The equations defining the total thickness $d_6$ of the organic electroluminescent layer and the distance z approximately separating the center of the emissive organic sublayer 61 from the reflective lower electrode 7 make it possible for the optical cavity effect obtained between the two electrodes to appreciably improve the extraction efficiency of the light emitted by the diode.

Firstly, $d_6$ is chosen approximately such that:

$$d_6 = \frac{\lambda}{2n_6}\left(q - \frac{\phi_{tot}}{2\pi}\right)$$

where q is any integer;

where λ is again approximately the maximum emission wavelength of the diode;

$n_6$ is the average index of the organic electroluminescent layer 6 at this wavelength; and where $\phi_{tot}$ is the total phase shift of an emitted light ray, after reflection off the reflective lower electrode 7 and off the stack described above consisting of the three upper layers or sublayers 5, 4, 2.

The equation fixing the approximate value of $d_6$ expresses constructive interference of the light emitted in the optical cavity between the lower electrode 7 and the semireflective upper stack 5, 4, 2.

Secondly, the thickness of the sublayer 62 for injecting and/or transporting holes is chosen approximately so that the distance z is approximately equal to:

$$z = \frac{\lambda}{2n_6}\left(r - \frac{\phi_{inf}}{2\pi}\right)$$

where r is any integer;

where $n_6$ is the average index of the organic electroluminescent sublayers at the wavelength λ: here, $n_6$=1.7; and where $\phi_{inf}$ is the phase shift of a light ray emitted, after reflection off the reflective lower electrode: here, $\phi_{inf}$=2.6 rd.

The equation fixing the approximate value of z expresses constructive interference between the light emitted in the emissive sublayer 61 and the light reflected off the reflective lower electrode 7.

The two types of interference above advantageously cooperate so as to obtain a very high light extraction factor, thereby improving the luminous efficiency of the diode.

Figure 5:
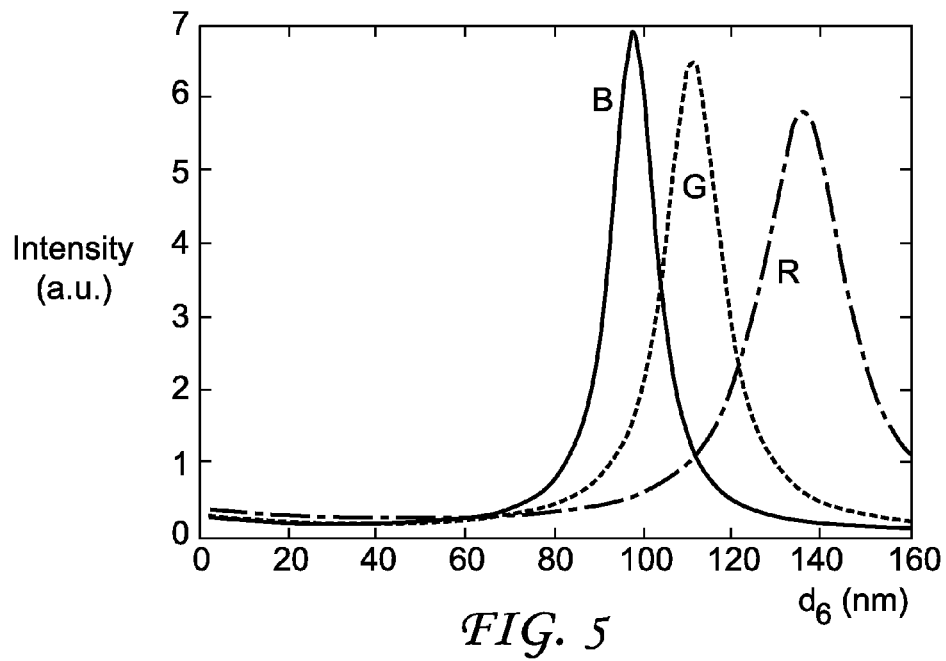
FIG. 5 shows the variation of the light intensity (in arbitrary units) of the diode according to the first embodiment as a function of the thickness $d_6$ (in nm) of the organic layer of this diode.

An equivalent means for establishing the value of $d_6$ that provides constructive interference in the optical cavity consists in extracting this datum from one of the curves of FIG. 5, which, with the aid of a simple numerical model within the competence of a person skilled in the art or of diodes having various geometrical characteristics, gives the variations of the light intensity actually output by the diode (extracted light, in arbitrary units) as a function of the value of $d_6$ (in nm). The value of $d_6$ is chosen that gives approximately the maximum light intensity. These $d_6$ values are given in Table 2 below for the red, green and blue emission colors.

Since:

$z=d_{61}/2+d_{62}+d_{63}$, approximately: as $d_{61}$ (=20 nm) and $d_{63}$ (=10 nm) are already known, $d_{62}$ can therefore be deduced therefrom; and $d_6=d_{61}+d_{62}+d_{63}+d_{64}+d_{65}=z+d_{61}/2+d_{64}+d_{65}$: as $d_{61}$ (=20 nm) and $d_{64}$ (=10 nm) are already known, $d_{65}$ can therefore be deduced therefrom.

All the values obtained are given in Table 2 for each color—red, green and blue.

The abbreviation "Int" in the last column denotes the extracted light intensity in arbitrary units.

A top-emitting light-emitting diode or array of light-emitting diodes exhibiting excellent luminous efficiency is obtained, as a result of the combination of the features specific to the invention that have just been described.

TABLE 2

| Color | λ (nm) | Ref. 4 ITO $d_4$ (nm) | z (nm) | EIL/ETL $d_{62}$ (nm) | HBL $d_{63}$ (nm) | EML $d_{61}$ (nm) | EBL $d_{64}$ (nm) | HIL/HTL $d_{65}$ (nm) | Tot. $d_6$ (nm) | Int. (a.u.) |
|---|---|---|---|---|---|---|---|---|---|---|
| Blue | 452 | 30 | 53 | 23 | 10 | 20 | 10 | 37 | 100 | 6.7 |
| Green | 516 | 40 | 61 | 31 | 10 | 20 | 10 | 44 | 115 | 6.7 |
| Red | 636 | 60 | 75 | 45 | 10 | 20 | 10 | 55 | 140 | 6.0 |

According to a second embodiment of the invention, which is a variant of the first embodiment described above, the first transparent conducting sublayer 4 is made of titanium oxide instead of ITO, as herein described.

Figure 6:
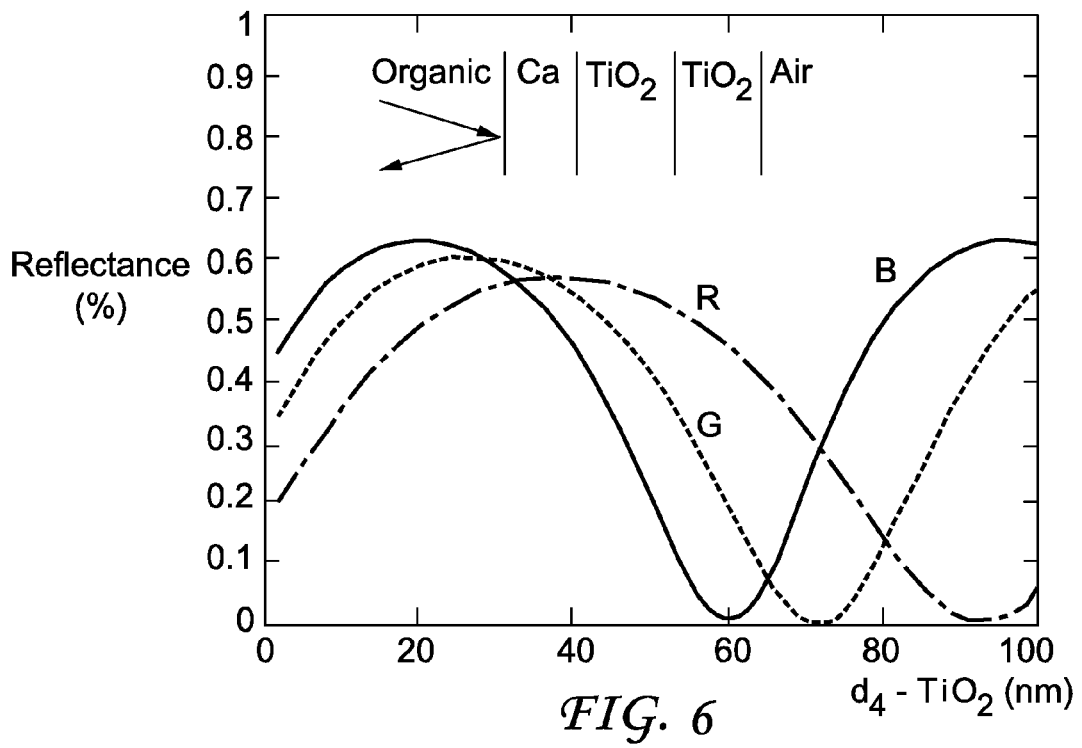
FIG. 6 shows the variation of the reflectance of a stack consisting of a 15 nm calcium sublayer, a titanium oxide sublayer of thickness $d_4$ and a 27 nm titanium oxide dielectric layer as a function of the thickness $d_4$ (in nm) of the titanium oxide sublayer that are used as upper layers or sublayers in the diode according to a second embodiment of the invention.
Figure 7:
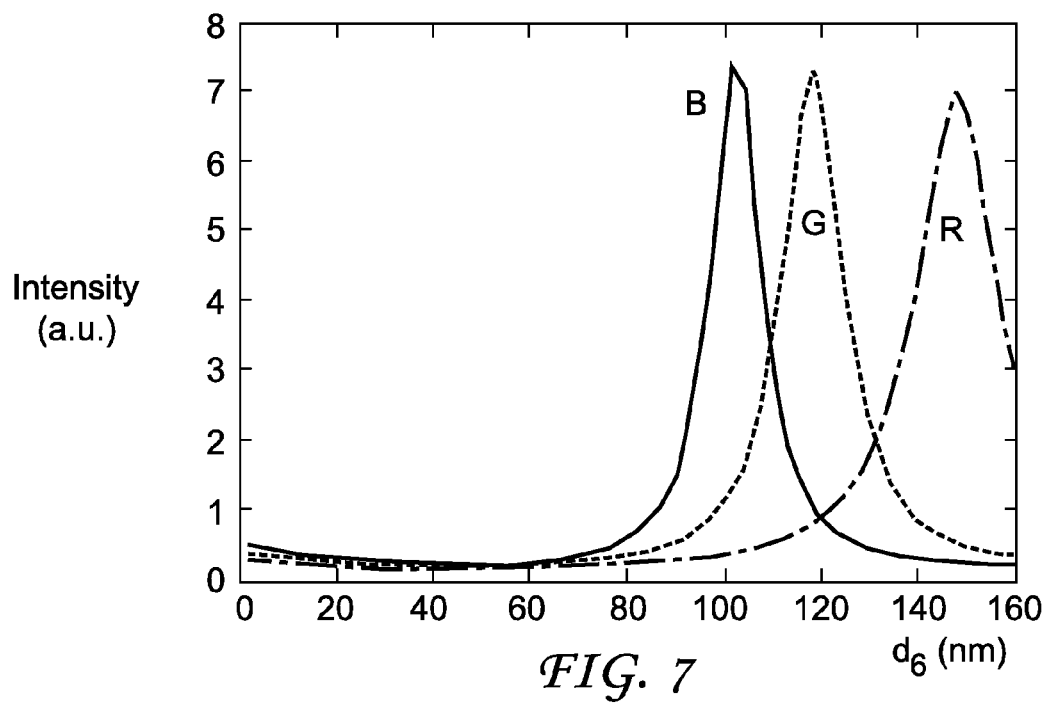
FIG. 7 shows the variation of the light intensity (in arbitrary units) of the diode according to the second embodiment as a function of the thickness $d_6$ (in nm) of the organic layer of this diode.

From FIG. 6, replacing FIG. 4, and from FIG. 7, replacing FIG. 5, the new results given in Table 3 are obtained in a manner similar to that described above:

TABLE 3

| Color | λ (nm) | Ref. 4 ITO $d_4$ (nm) | z (nm) | EIL/ETL Ref. 62 (nm) | HBL Ref. 63 (nm) | EML Ref. 61 (nm) | EBL Ref. 64 (nm) | HIL/HTL Ref. 65 (nm) | Tot. $d_6$ (nm) | Int. (a.u.) |
|---|---|---|---|---|---|---|---|---|---|---|
| Blue | 452 | 20 | 53 | 23 | 10 | 20 | 10 | 42 | 105 | 7.1 |
| Green | 516 | 36 | 61 | 31 | 10 | 20 | 10 | 49 | 120 | 7.0 |
| Red | 636 | 38 | 75 | 45 | 10 | 20 | 10 | 65 | 150 | 6.8 |

The present invention also applies to an organic light-emitting diode or panel in which the charges are injected via doped organic layers. It is obvious to a person skilled in the art that the invention can be applied to other types of diodes and illumination or display panels without departing from the scope of the following claims.

The invention claimed is:

1. An organic light-emitting diode capable of emitting light, comprising:
    a substrate;
    an organic electroluminescent layer capable of emitting light and being interposed between a lower electrode and a partially transparent upper electrode, said electrodes configured to pass a current through the organic electroluminescent layer and thus cause, within this layer, the emission of light,
    said partially transparent upper electrode comprising at least one transparent or semitransparent conducting sublayer of approximately uniform thickness and a current distributing metal sublayer having opaque zones for distributing current and between which gaps are defined that form windows for passage of the light emitted by the electroluminescent layer;
    a reflective lower layer interposed between said substrate and said organic electroluminescent layer or is integrated into the substrate, said reflective lower layer for reflecting said emitted light; and
    a transparent dielectric antireflection layer of approximately uniform thickness and having an external face in contact with a medium, such as air, and, an internal face in contact with a said transparent conducting sublayer and said opaque metal sublayer, wherein:
    a material and the thickness of said dielectric antireflection layer are chosen with a material of said current-distributing metal sublayer so that measured reflectance at the opaque zones, at normal incidence, and at a wavelength $\lambda_{amb}$ close to 550 nm, is less than 0.1;
    wherein $\lambda$ is defined as a wavelength close to a maximum of emittance for the emitted light, and wherein the material, the index measured at the wavelength $\lambda$ and the thickness of said dielectric antireflection layer are chosen with the material, the index measured at the wavelength $\lambda$ and the thickness of the at least one transparent or semitransparent conducting sublayer such that a semireflective upper layer is obtained and configured to partially reflect said emitted light and to have its maximum of reflectance measured at wavelength $\lambda$ at normal incidence,
    wherein the reflective lower layer and the semireflective upper layer define an optical cavity for the light emitted by the organic electroluminescent layer, and a distance $d_6$ between these layers delimiting said optical cavity being adapted to obtain constructive interference of the light emitted within this organic electroluminescent layer.

2. The diode as claimed in claim 1, wherein, $n_1$ is defined as the optical index of said medium at the wavelength $\lambda_{amb}$, a material of index $n_2 (\lambda_{amb})$ is measured at the wavelength $\lambda_{amb}$, and a thickness $d_2$ of said dielectric antireflection layer are chosen with a material of index $\tilde{n}_3$ of said current-distributing metal sublayer measured at the same wavelength $\lambda_{amb}$ and is defined by its argument $n_3$ and its phase $\Phi$ such that $\tilde{n}_3 = n_3 e^{i\Phi}$, so as to approximately satisfy the equation:

$$n_2(\lambda_{amb}) = \frac{\sqrt{-(n_1\cos(\phi) - n_3 + n_3\sin^2(\phi))n_3 n_1 (n_1\sin^2(\phi) + n_3\cos(\phi) - n_1)}}{-(n_1\sin^2(\phi) + n_3\cos(\phi) - n_1)}.$$

3. The diode as claimed in claim 1, wherein a material of index $n_2(\lambda_{amb})$ measured at a wavelength $\lambda_{amb}$ close to 550 nm, and a thickness $d_2$ of said dielectric antireflection layer are chosen so as to approximately satisfy the equation:

$$d_2 = \frac{\lambda_{amb}}{4n_2(\lambda_{amb})} \left( p - \frac{\phi_{2-3}}{\pi} \right)$$

where p is any even integer and where $\Phi_{2-3}$ is the phase shift of a light ray of wavelength $\lambda_{amb}$ after reflection at an interface between the dielectric antireflection layer and the current-distributing metal sublayer.

4. The diode as claimed in claim 1, wherein a material of said dielectric antireflection layer comprises silicon nitride and a material of said current-distributing metal sublayer comprises tantalum.

5. The diode as claimed in claim 1, wherein said distance $d_6$ approximately satisfies the following equation:

$$d_6 = \frac{\lambda}{2n_6}\left( q - \frac{\phi_{tot}}{2\pi} \right)$$

where q is any integer;
where $n_6$ is the average index of the organic electroluminescent layer at wavelength $\lambda$; and
where $\Phi_{tot}$ is the total phase shift of a ray of emitted light, after reflection off the reflective lower layer and off the semireflective upper layer.

6. The diode as claimed in claim 1, wherein a distance separating the organic electroluminescent layer from the reflective lower layer is chosen so as to obtain constructive interference between said emitted light and the light reflected off this reflective lower layer.

7. The diode as claimed in claim 6, wherein said organic electroluminescent layer further comprises an emissive organic sublayer and at least one nonemissive lower organic sublayer interposed between said reflective lower layer and said emissive sublayer, wherein a thickness of the at least one nonemissive lower organic sublayer is adapted so that a distance z separating a center of said emissive organic sublayer of said reflective lower layer approximately satisfies the equation:

$$z = \frac{\lambda}{2n_6}\left( r - \frac{\phi_{inf}}{2\pi} \right)$$

where r is any integer;
where $\lambda$ is wavelength close to the maximum of emittance for the emitted light and $n_6$ is the average index of the organic electroluminescent layer at this wavelength; and
where $\Phi_{inf}$ is the phase shift of a ray of emitted light after reflection off the reflective lower layer.

8. An image display or illumination panel comprising a plurality of diodes as claimed claim 1, wherein these diodes are supported by the same substrate.

9. The panel as claimed in claim 8, wherein said upper electrode is common to the plurality of said diodes.

10. The panel as claimed in claim 9, wherein said opaque conducting sublayer of the common upper electrode forms a current-distributing grid on this electrode.

11. The diode as claimed in claim 1, wherein a material of said dielectric antireflection layer comprises titanium oxide and a material of said current-distributing metal sublayer is a metal selected from a group consisting of nickel, chromium, titanium and vanadium.

12. The diode as claimed in claim 1, wherein a material of said dielectric antireflection layer comprises zinc selenide and a material of said current-distributing metal sublayer is a metal selected from a group consisting of nickel, chromium, titanium and vanadium.

* * * * *